(12) United States Patent
Rippel et al.

(10) Patent No.: US 11,791,118 B2
(45) Date of Patent: Oct. 17, 2023

(54) POLYPHASE SWITCHING REGULATOR

(71) Applicant: ENURE, INC., Los Angeles, CA (US)

(72) Inventors: Wally E. Rippel, Altadena, CA (US); Eric E. Rippel, Los Angeles, CA (US)

(73) Assignee: Enure, Inc., Los Angeles, CA (US)

( * ) Notice: Subject to any disclaimer, the term of this patent is extended or adjusted under 35 U.S.C. 154(b) by 542 days.

(21) Appl. No.: 16/833,441

(22) Filed: Mar. 27, 2020

(65) Prior Publication Data

US 2020/0312595 A1 Oct. 1, 2020

Related U.S. Application Data

(60) Provisional application No. 62/824,931, filed on Mar. 27, 2019.

(51) Int. Cl.
*H02M 1/00* (2006.01)
*H02M 3/158* (2006.01)
*H01H 50/16* (2006.01)
*H02M 7/537* (2006.01)
*H03K 17/51* (2006.01)
*H01F 17/04* (2006.01)
*H01F 27/30* (2006.01)

(52) U.S. Cl.
CPC ........... *H01H 50/163* (2013.01); *H01F 17/04* (2013.01); *H01F 27/306* (2013.01); *H02M 7/537* (2013.01); *H03K 17/51* (2013.01); *H02M 1/007* (2021.05); *H02M 1/0074* (2021.05); *H02M 1/0077* (2021.05); *H02M 3/1584* (2013.01)

(58) Field of Classification Search
CPC .. H02M 1/007; H02M 1/0074; H02M 1/0077; H02M 3/1584
See application file for complete search history.

(56) References Cited

U.S. PATENT DOCUMENTS

| 3,648,149 A | 3/1972 | Brown et al. |
| 3,753,062 A | 8/1973 | Greenwell |
| 4,446,393 A | 5/1984 | Finegold |

(Continued)

OTHER PUBLICATIONS

International Search Report and Written Opinion of the International Searching Authority, dated Jun. 26, 2020, Corresponding to PCT/US2020/025535, 17 pages.

*Primary Examiner* — Gary A Nash
(74) *Attorney, Agent, or Firm* — Lewis Roca Rothgerber Christie LLP

(57) ABSTRACT

A switching regulator is disclosed comprising a high-voltage port, a low-voltage port, n number of switching poles, a magnetic element, and a controller. In turn, each switching pole connects across the high-voltage port and may consist of either one switch and one diode or two switches and two diodes. In turn, the magnetic element comprises a ferro-core having n number of magnetic branches, each of which includes a winding. Each winding start connects to the phase node of a respective switching pole, while each winding finish connects, in common, to one side of the low-voltage port. An n+1$^{th}$ magnetic branch establishes a defined common-mode inductance which, in combination with transformer action, limits current ripple. The transformer action serves to exchange ripple power between phases such that the need for inductance is greatly reduced.

22 Claims, 19 Drawing Sheets

(56) References Cited

U.S. PATENT DOCUMENTS

| | | | |
|---|---|---|---|
| 6,518,814 B1 | 2/2003 | Majid et al. | |
| 6,784,644 B2* | 8/2004 | Xu | H02M 3/1584 323/225 |
| 7,023,182 B1* | 4/2006 | Kleine | H02M 3/157 323/212 |
| 7,791,321 B2* | 9/2010 | Xu | H02M 3/1584 323/361 |
| 2003/0210110 A1 | 11/2003 | Perreault et al. | |
| 2004/0160141 A1 | 8/2004 | Dube | |
| 2004/0233690 A1* | 11/2004 | Ledenev | H02M 3/1584 363/133 |
| 2006/0017347 A1 | 1/2006 | Rahman | |
| 2008/0169780 A1 | 7/2008 | Pirozzi et al. | |
| 2011/0267019 A1* | 11/2011 | Krishnamurthy | H02M 3/157 323/283 |
| 2011/0316461 A1 | 12/2011 | Rippel | |
| 2014/0091650 A1 | 4/2014 | Lenschow | |
| 2016/0072382 A1 | 3/2016 | Ranmuthu | |
| 2016/0098054 A1* | 4/2016 | Wei | H02M 3/1584 323/361 |
| 2016/0125998 A1 | 5/2016 | Bhide et al. | |
| 2016/0149489 A1* | 5/2016 | Tang | G01R 21/06 702/61 |
| 2017/0229961 A1* | 8/2017 | Zhang | H02M 3/1584 |

* cited by examiner

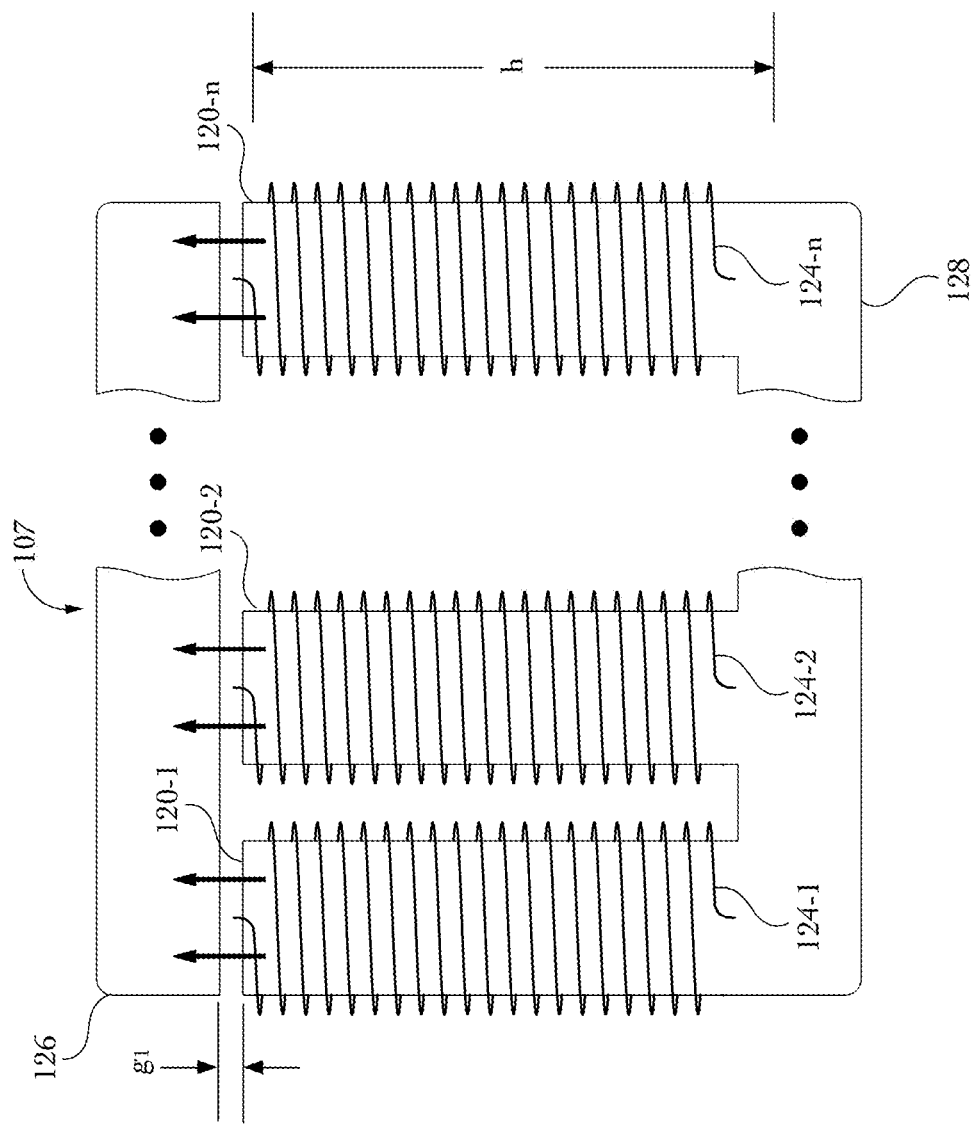

POLYPHASE SWITCHING REGULATOR

CROSS-REFERENCE TO RELATED APPLICATION(S)

The present application claims priority to and the benefit of U.S. Provisional Application No. 62/824,931, filed Mar. 27, 2019, entitled "POLYPHASE SWITCHING REGULATOR", the entire content of which is incorporated herein by reference.

FIELD

One or more aspects of embodiments according to the present disclosure relate to regulators, and more particularly to a polyphase switching regulator.

BACKGROUND

FIG. 1a shows a single-phase regulator. During the on-time, part of the energy applied to high voltage 102 is transferred to low voltage port 116 and the remainder is stored in inductor 195. During the off-time, the energy previously stored in inductor is transferred to low voltage port 116. In steady state, the output voltage is equal to D times the input voltage and the output current is equal to 1/D times the input current.

As shown in FIG. 1b, the inductor current includes a DC component plus an AC ripple component. As the product of inductance and switching frequency is increased, the AC ripple current decreases. This in turn means that a smaller output capacitor can be used and that AC losses within the inductor 195 are reduced. Unfortunately, the inductor size and DC conductor loss both increase with inductance. Furthermore, as switching frequency is increased, switching losses within switching pole 106 increase proportionately. Hence, a trade-off exists between inductor size and DC loss versus AC loss and capacitor size. In some embodiments, the trade-off solution is where the rms ripple current is somewhere between 10% and 20% of the rated DC current. As used herein, a "switching pole" is a circuit element that operates as a single-pole, double-throw switch.

As shown in FIG. 2a, individual switching regulators may be connected in parallel to provide a polyphase regulator 103 which comprises high voltage port 102, high voltage capacitor 104, switching poles 106-1 through 106-n, inductors 195-1 through 195-n, low voltage capacitor 114, and low voltage port 116. Switching waveforms for each of the n switching poles may be staggered as shown in FIG. 2b.

With this approach, ripple currents applied to capacitors 104 and 114 are both significantly reduced due to cancellation of AC current harmonics. This enables both capacitors to be significantly reduced in size. However, the total size and mass associated with inductors 195-1 through 195-n, remains similar to that of the single phase regulator. Polyphase regulators have the added advantage that individual switch currents are reduced—compared with single phase; in some cases this has the benefit of reduced emi and reduced problems associated with stray inductance. Polyphase switching regulators may make sense where current or power levels are relatively high and where capacitor size is an issue. Their down-side is added complexity.

The polyphase regulator concept can be improved and simplified by integrating inductors 195-1 through 195-n into a single unit as shown in FIG. 2c. While there are multiple versions of this concept, one is disclosed herein which significantly reduces the overall magnetics size, mass, and winding loss compared with conventional switching regulators. With this new magnetic element, both transformer action and inductive energy storage effects are utilized such that current ripple associated with each phase may be small compared with the respective flux density swing. Additionally, the design of the magnetic element may be such that efficient heat transfer is achieved both for the windings and the ferro-core.

It should be noted that, like the FIG. 1a topology, the FIG. 2a topology is capable of buck, boost, and buck-boost modes of operation, depending on the selection of high-side and low-side semiconductor elements. For example, in the case where high-side semiconductor elements 108 are semiconductor switches and low-side semiconductor elements 110 are diodes, buck mode operation is enabled such that high voltage port 102 is an input and low voltage port 116 is an output. In buck mode operation and in boost mode operation, power flow may be unidirectional. In the case where both high-side and low-side semiconductor elements are semiconductor switches (with anti-parallel diodes), buck-boost mode operation is enabled and DC power can be transferred bidirectionally between the high voltage and low voltage ports.

In the following, a new concept is disclosed wherein the individual inductors of FIG. 2a are integrated into a single unit such that both transformer action and energy storage are utilized thus enabling magnetics size, mass, and DC loss to be reduced.

SUMMARY

According to an embodiment of the present invention, there is provided a circuit having a first input conductor, a second input conductor, a first output conductor, and a second output conductor, the circuit including: a first switching pole; a second switching pole; and a magnetic element, the magnetic element including a plurality of windings including a first winding connected to the first switching pole and a second winding connected to the second switching pole, the mutual inductance of the first winding and the second winding being at least 50% of the self-inductance of the first winding.

In some embodiments, the magnetic element includes a core composed at least in part of solid material, the core having at least two prongs, a prong of the at least two prongs extending through the first winding.

In some embodiments, the core has a gap.

In some embodiments, a magnetic circuit passing through the first winding extends through the gap.

In some embodiments, a magnetic circuit passing through the first winding does not extend through a gap in the core.

In some embodiments, a magnetic circuit passing through the first winding does not pass through any other winding of the plurality of windings.

In some embodiments, the core is composed of a material selected from the group consisting of magnetic laminations, powdered iron, ferrite, and combinations thereof.

In some embodiments, the circuit further includes an inductor connected in series with the magnetic element.

In some embodiments, the first winding is a single layer winding which is face wound or edge wound.

In some embodiments, the first winding is multilayered.

In some embodiments, power flow is unidirectional.

In some embodiments, power flow maybe bidirectional.

In some embodiments, the circuit includes a high voltage port and a low voltage port.

In some embodiments, the circuit includes a capacitor connected across the high voltage port or a capacitor connected across the low voltage port.

In some embodiments, each switching pole includes a high side semiconductor switch and a low side diode.

In some embodiments, each switching pole includes a low side semiconductor switch and a high side diode.

In some embodiments, each switching pole contains a high side semiconductor switch in parallel with a diode and a low side semiconductor switch in parallel with a diode.

In some embodiments, the circuit includes a plurality of switching poles including the first switching pole and the second switching pole, the circuit further including a control circuit to control the switching poles with respective control waveforms, the duty cycles of the control waveforms being symmetrically spaced and equal.

In some embodiments, all of the coils have the same number of turns.

In some embodiments: the magnetic element includes a core, the first winding closely conforms to a first heat removal surface, and at least a portion of the core conforms to a second heat removal surface.

In some embodiments, the magnetic element further includes: a thermally conductive material between the first winding and the first heat removal surface, and a thermally conductive material between at least a portion of the core and the second heat removal surface.

In some embodiments, a coolant is forced in direct contact with at least a portion of at least one winding.

According to an embodiment of the present invention, there is provided a polyphase inverter including a plurality of circuits.

In some embodiments, the polyphase inverter is configured to supply power for an electric machine or a utility load.

BRIEF DESCRIPTION OF THE DRAWINGS

These and other features and advantages of the present disclosure will be appreciated and understood with reference to the specification, claims, and appended drawings wherein:

FIG. 3b is a schematic representation of a second embodiment of an n-phase magnetic element which can be used in the FIG. 2a regulator, according to an embodiment of the present disclosure.

DETAILED DESCRIPTION

The detailed description set forth below in connection with the appended drawings is intended as a description of exemplary embodiments of a polyphase switching regulator provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
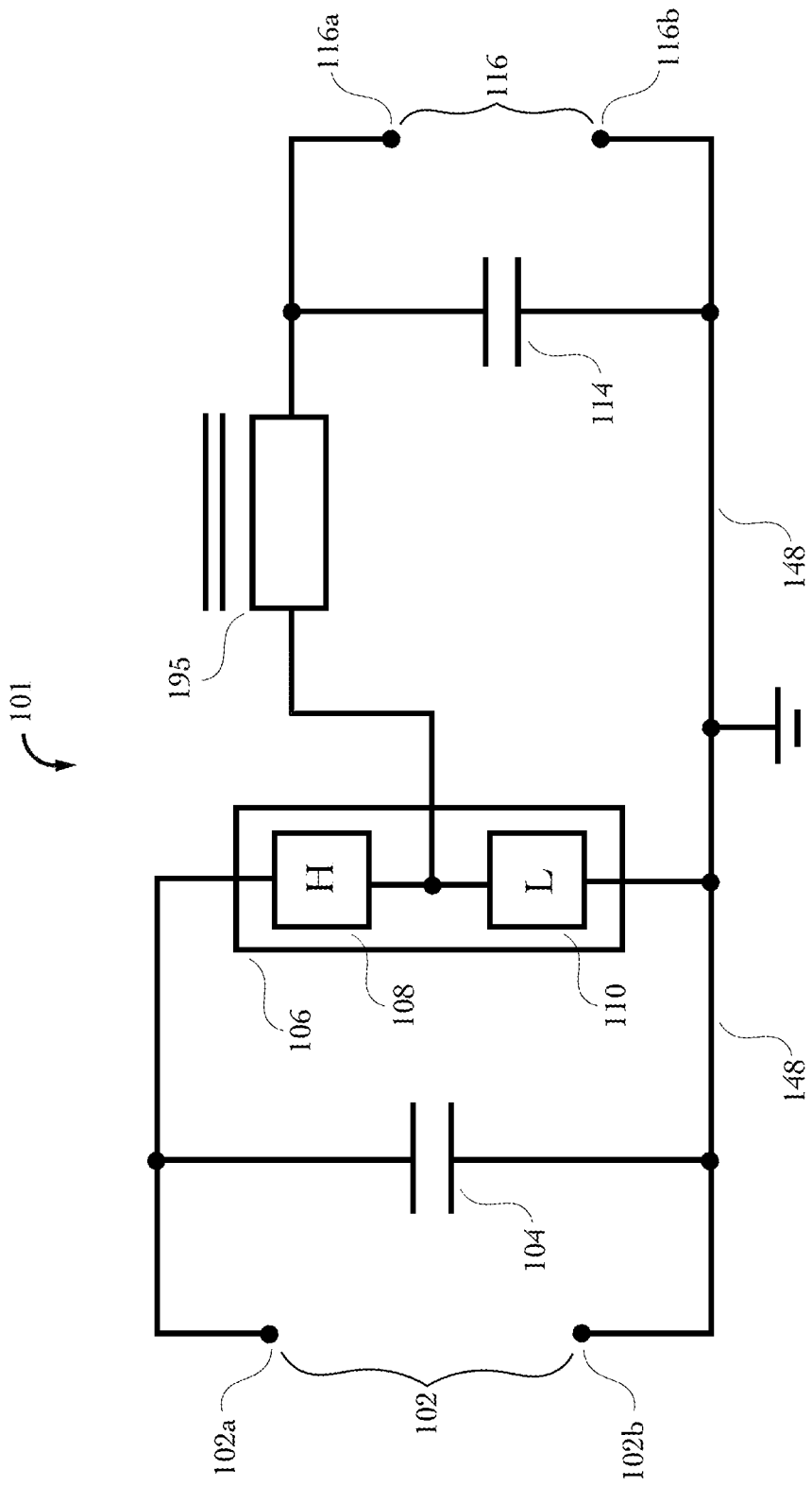
FIG. 1a shows power topology for a generic DC to DC regulator, according to an embodiment of the present disclosure.
Figure 1B:
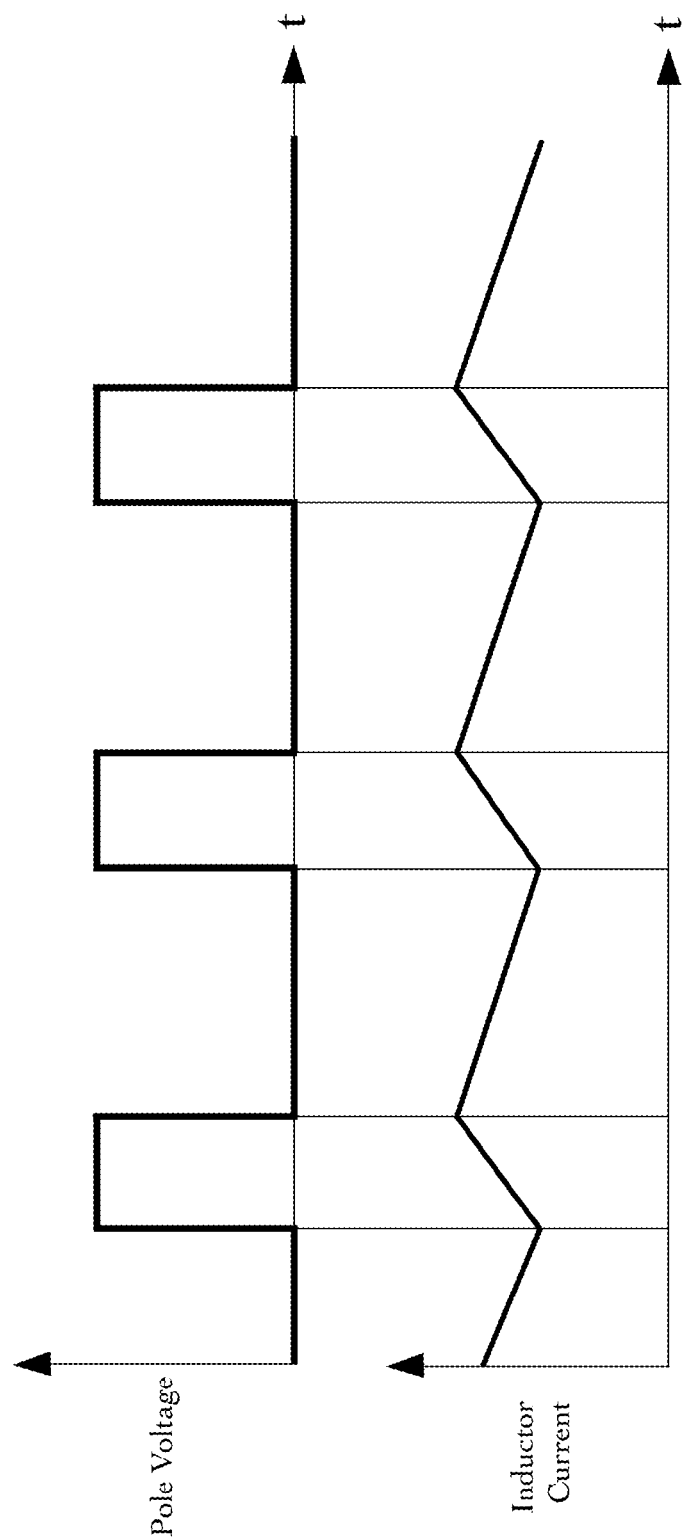
FIG. 1b shows pole voltage and inductor current waveforms associated with FIG. 1a, according to an embodiment of the present disclosure.
Figure 2A:
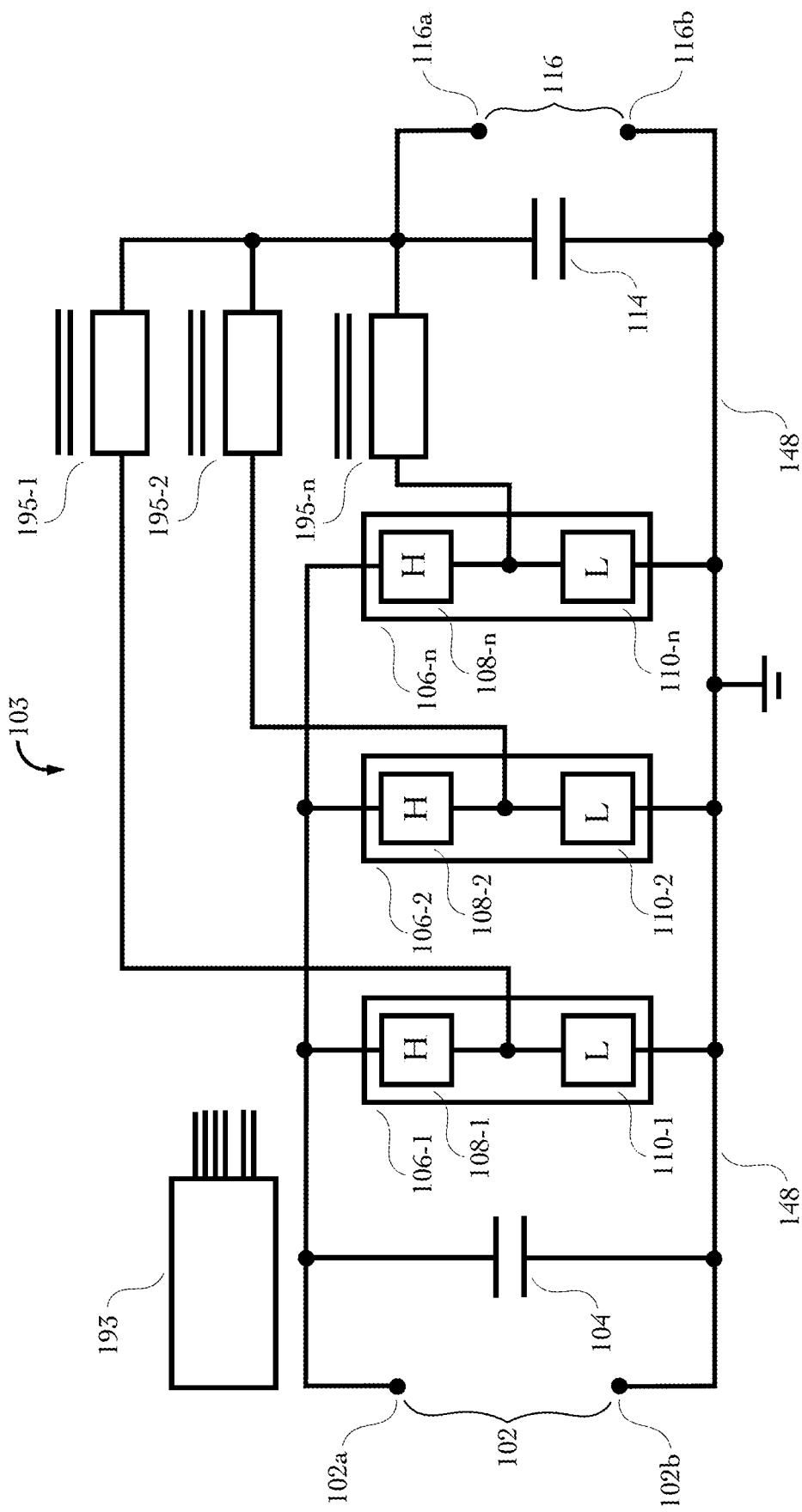
FIG. 2a an n-phase generic DC to DC regulator, according to an embodiment of the present disclosure.
Figure 2B:
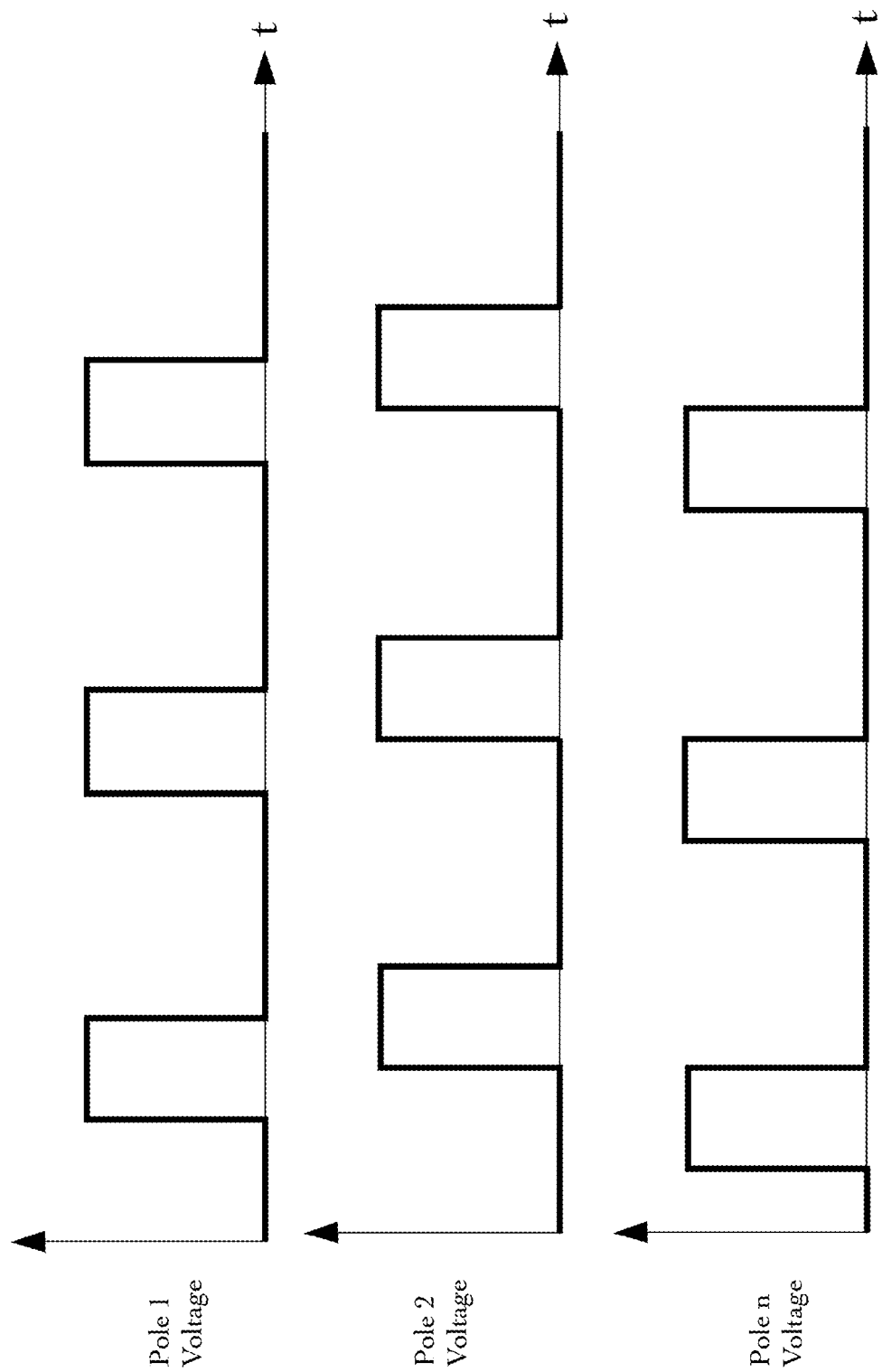
FIG. 2b shows the pole voltages associated with FIG. 2a, according to an embodiment of the present disclosure.

FIGS. 1a and 1b are background dealing with a single phase generic switching regulator, while FIGS. 2a and 2b are background dealing with a polyphase generic DC to DC regulator. Referring to FIG. 1a, switching pole 106 and high voltage capacitor 104 connect across high voltage port 102. Inductor 195 connects between the phase node of switching pole 106 and one side of low voltage port 116. In turn, switching pole 106 consists of series connected high-side semiconductor element 108 and low-side semiconductor element 110. In the case where semiconductor element 108 is a semiconductor switch (e.g. IGBT or MOSFET), and where device 110 is a diode, buck mode operation is possible and input voltage applied at port 102 is "stepped down" to a lower voltage which is provided as an output at port 116. In the case where low-side semiconductor element 110 is a semiconductor switch and high-side semiconductor element 108 is a diode, boost mode operation is possible, where port 116 is the input and port 102 is the output. Where both semiconductor elements 108 and 110 are semiconductor switches with anti-parallel diodes, buck-boost mode operation is possible. As used herein, the terms "high voltage" and "low voltage" in describing the high voltage port and the low voltage port are used only to distinguish these two ports; in operation the voltage at the high voltage port 102 may be greater than the voltage at the low voltage port 116. Each of these ports may have two conductors which may be referred to as a "positive side" and a "negative side", respectively. In this usage, the qualifiers "positive and "negative" are used only to distinguish the conductors, and, for example, the voltage on the positive side may be negative with respect to the voltage on the negative side. In FIG. 1a, a common conductor 148 connects one conductor 102b of the high voltage port 102 to one conductor 116b of the low voltage port 116.

In the case of FIG. 2a, operation is similar in all cases to that of FIG. 1a, except that n separate phases operate in parallel as opposed to a single phase. Since parallel paths are established which behave as voltage sources, provision must be made to insure that DC current components remain balanced. This can be achieved where individual phase currents are sensed and corresponding duty cycles are controlled (e.g., by a controller 193 as shown in FIGS. 2a-2f) such that desired currents for each phase are achieved. Balance can also be achieved by maintaining individual duty cycles precisely equal (which most digital controllers can provide). By symmetrically spacing the individual duty cycles, as shown in FIG. 2b, optimal current harmonic cancellation can be achieved at both ports. The duty cycles may be symmetrically spaced and equal as shown in FIG. 2b.

Figure 2C:
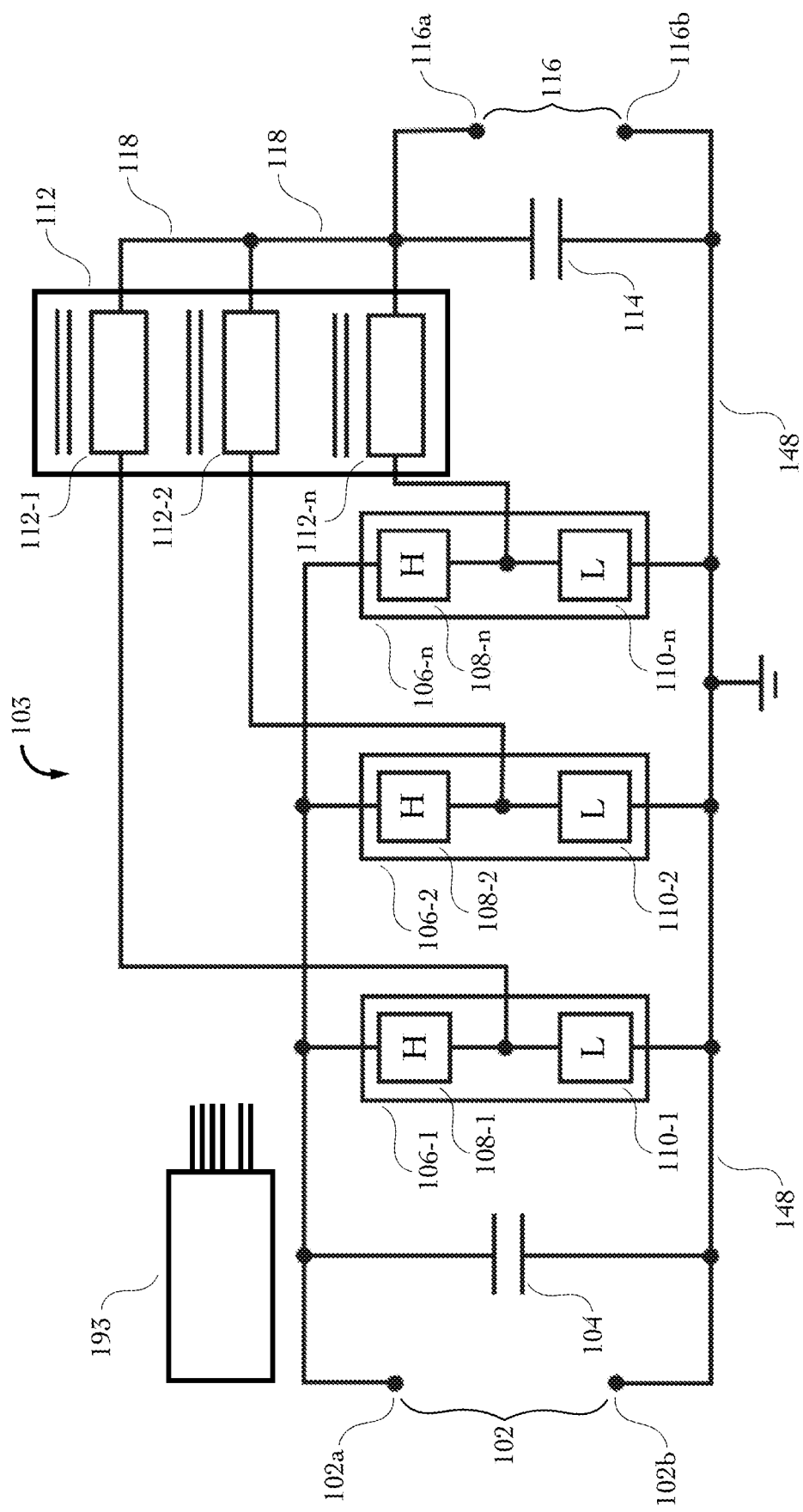
FIG. 2c shows a generic n-phase DC to DC regulator using an integrated magnetic element, according to an embodiment of the present disclosure.
Figure 3A:
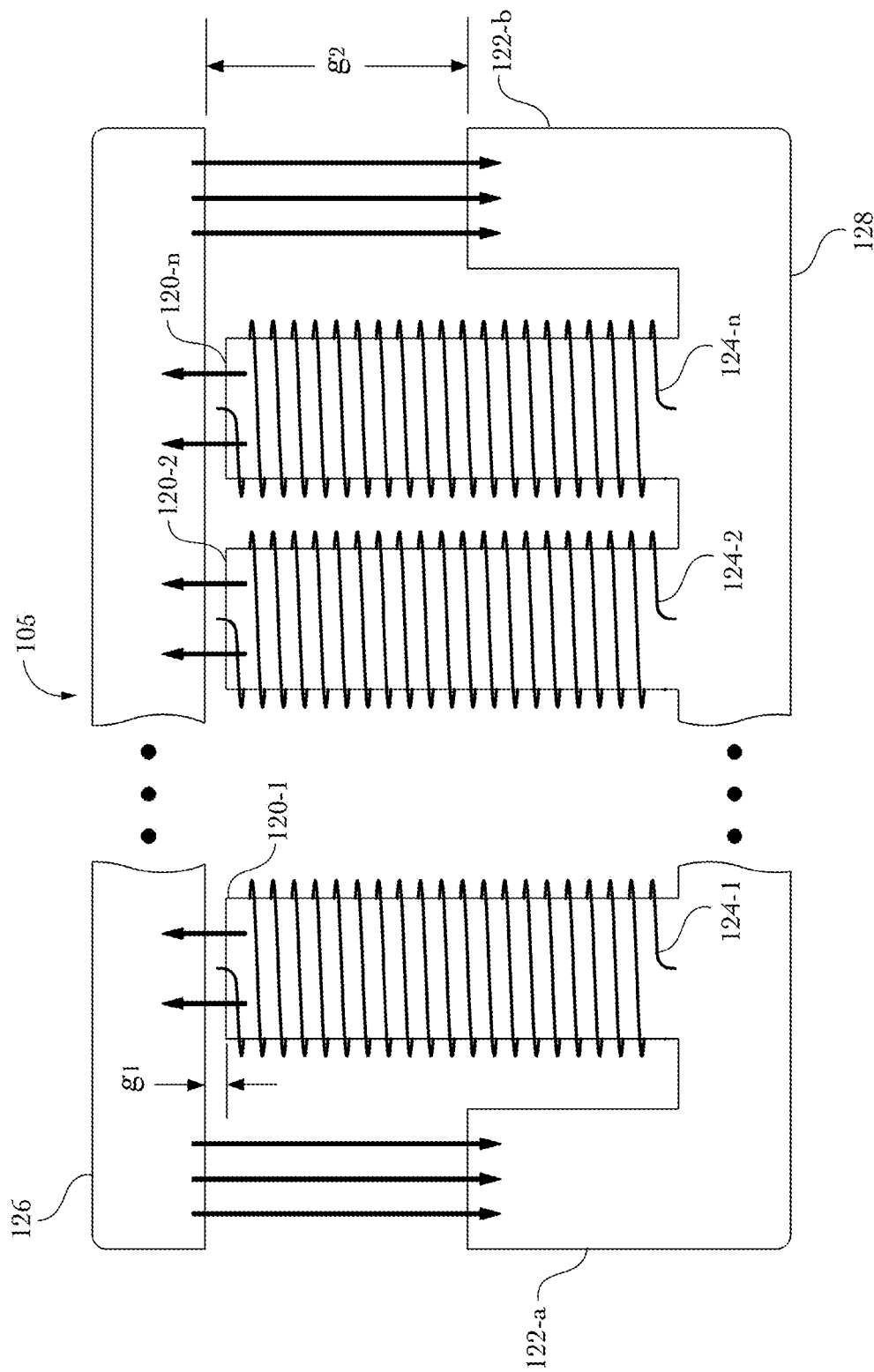
FIG. 3a is a schematic representation of a first embodiment of an n-phase magnetic element which can be used in the FIG. 2a regulator, according to an embodiment of the present disclosure.

As shown in FIG. 2c, the n number of inductors of FIG. 2b can be replaced by a single magnetic element 112. Various options exist for the magnetic element—ranging from cases which represent no more than a packaging exercise to those where the magnetic topology is altered. In FIG. 2c, a common conductor 148 connects one conductor 102b of the high voltage port 102 to one conductor 116b of the low voltage port 116. In FIGS. 3a and 3b, novel magnetic structures are shown which enable the magnetic element to be of reduced size and mass due to the fact that transformer action in addition to energy storage action is present. Each of these structures acts as a summing transformer combined with a series inductance. In the case of the FIG. 3a structure, the leakage inductance is increased by the addition of core prongs which provide defined paths for magnetic flux. In the case of the FIG. 3a structure, series inductance may be provided entirely by leakage inductance. In the magnetic element of FIG. 3a, there is, for each winding, a magnetic circuit passing through the winding that does not pass through any of the other windings and that instead passes through one of the auxiliary core prongs, e.g., through the core prong 122-a or the core prong 122-b.

Figure 2D:
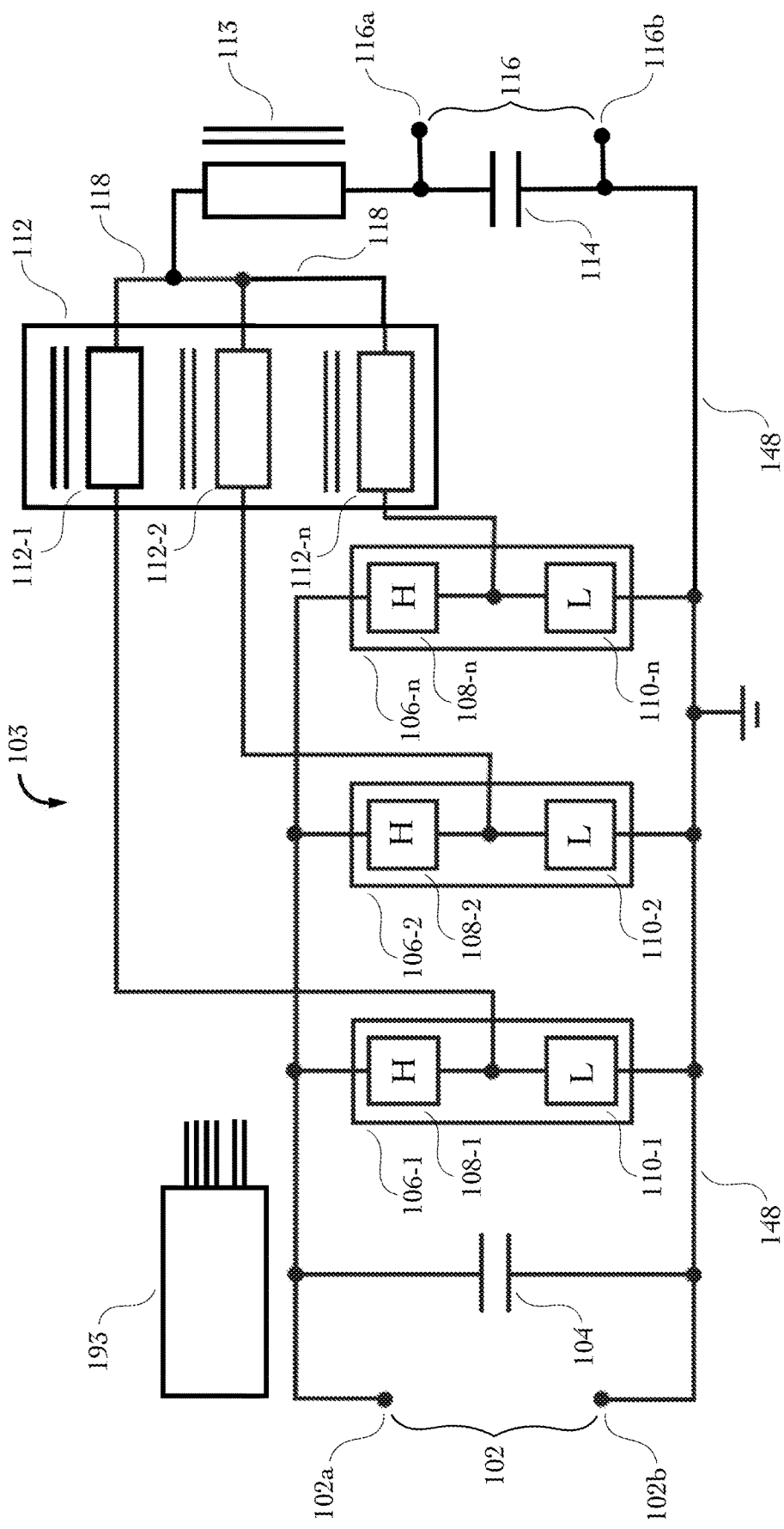
FIG. 2d shows a generic n-phase DC to DC regulator using an integrated magnetic element plus an external inductor, according to an embodiment of the present disclosure.

A "ripple suppression inductance" that is effectively connected in series with the output may have the effect of reducing ripple. This inductance may be leakage inductance of the magnetic element 112, or it may be (as mentioned below) the inductance of a separate inductor, connected in series with the output. If the magnetic element described by FIG. 2c does not have sufficient leakage inductance to limit ripple currents to the desired values, an external inductance 113 may be connected between the summing node 118 of magnetic element 112 and the node formed by port 116a in parallel with capacitance 114 (see FIG. 2d). In FIG. 2d, a common conductor 148 connects one conductor 102b of the high voltage port 102 to one conductor 116b of the low voltage port 116.

Figure 2E:
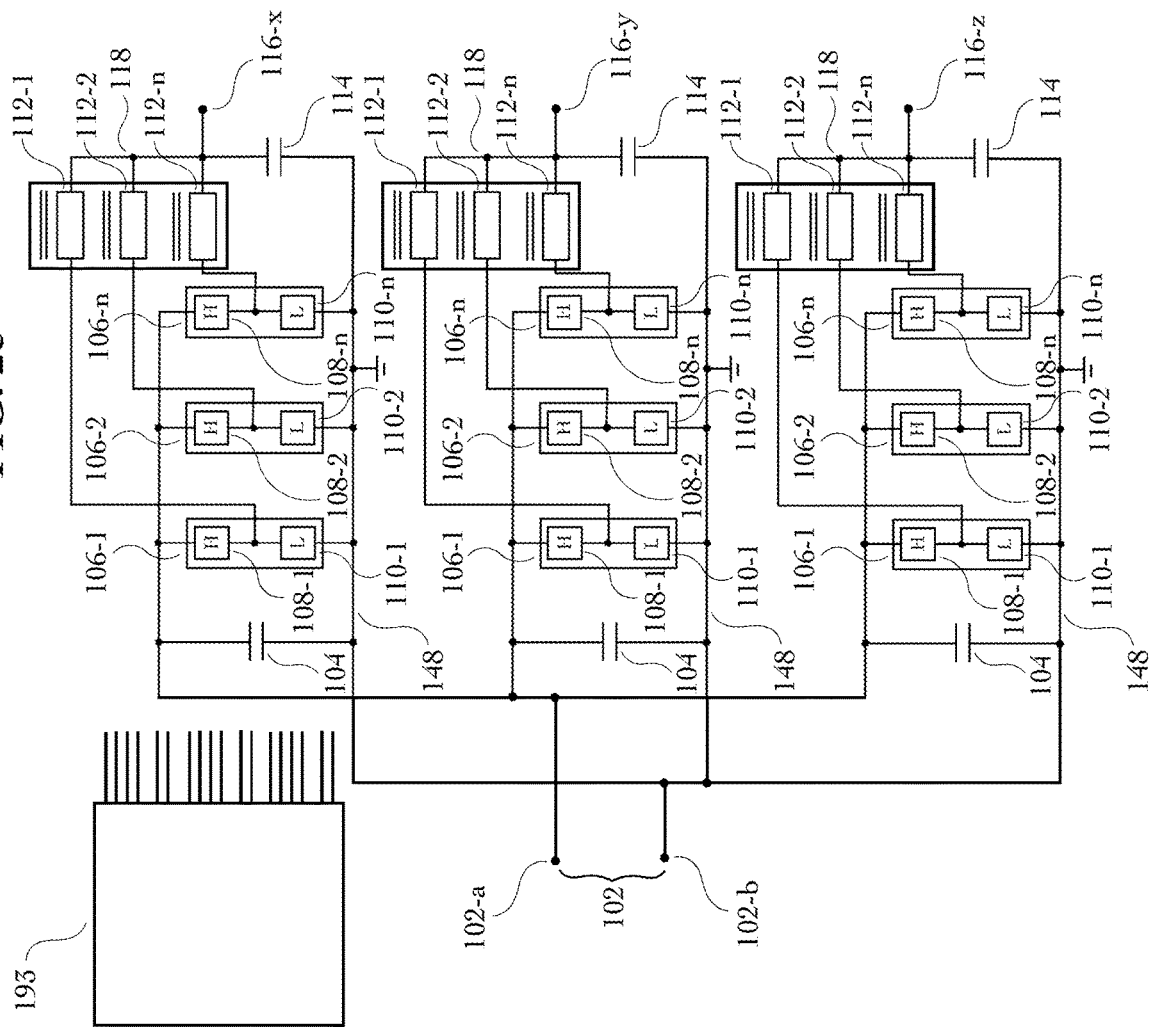
FIG. 2e is is a three-phase inverter using a FIG. 2a regulator for each phase, according to an embodiment of the present disclosure.

FIG. 2e shows an application where three FIG. 2c regulators are combined to form a three-phase inverter. Each regulator contains n number of phases. (Since the number of regulator phases can be confused with the number of inverter phases, regulator phases are designated as "sub-phases", while the term "phase" will apply at the inverter level.) DC power at port 102 is exchanged with AC power at AC port 116 in a manner similar to conventional three-phase inverters. The advantage of the FIG. 2e scheme compared with conventional inverters is that AC port switching ripple can be virtually eliminated—while maintaining low mass and high energy efficiency. In the case where electric machines, such as induction, permanent magnet, or reluctance machines 191 are driven (see FIG. 2f), the new inverter can reduce machine losses such that the machine rating and machine efficiency both improve. Furthermore, with the elimination of the high frequency switching components, winding capacitance no longer impacts machine efficiency. In turn, this allows system designs where both system voltage and winding capacitance may be relatively high without the usual impact on system efficiency.

Figure 2F:
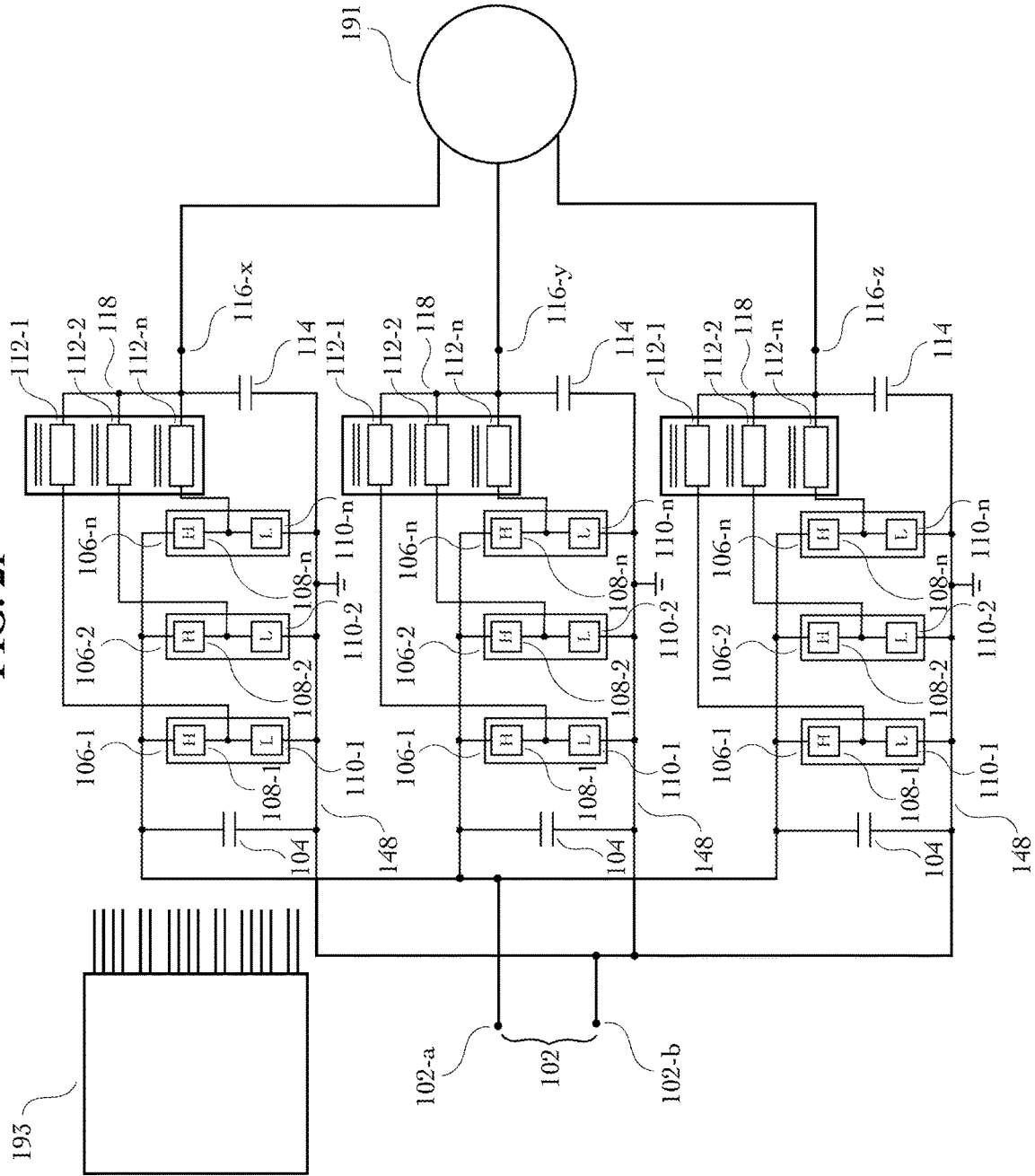
FIG. 2f is a block diagram of an inverter connected to an electric machine.

DC bus capacitors 104 may be combined into a single unit. In the case where the number of sub-phases is large, (e.g. six), AC port capacitors 114 may be deleted without significantly impacting losses and efficiency. The FIG. 2e scheme may be applied to single phase inversion (where only two regulators are used); it may also be applied to systems having greater than three phases and to systems which drive multiple loads. FIG. 2f is a block diagram of an inverter connected to an electric machine 191.

FIG. 3a is a schematic representation 105 of a first embodiment of an n-phase magnetic element which replaces the n inductors of FIG. 2a. The core includes n number of phase prongs 120-1 through 120-n having respective coils 124-1 through 124-n, each consisting of m number of turns, and each prong having an effective gap of $g_1$ as shown. Outer prongs 122-a and 122-b provide two parallel flux return paths at the ends of the core; each has a gap of $g_2$ as shown. The magnetic path is completed by core elements 126 and 128. Core prongs 122-a and 122-b may be replaced by a single prong; two prongs are chosen for reasons of symmetry and minimized total core mass.

When applied to the FIG. 2a topology, each winding start has a pulse voltage of magnitude $V_{in}$, duration D*T, and frequency 1/T. The n number of phase voltages are symmetrically spaced such that positive transitions occur at times 0, T/n, 2*T/n–(n−1)*T/n, where D is duty cycle (D ranges between 0 and 1). Each of the winding finishes connect to node 116a. In steady state, the voltage at port 116 is equal to the voltage at port 102 times D.

Excluding the magnetic effects associated with core prongs 122-a and 122-b, the FIG. 3a structure functions as a transformer where the sum of the magnetic fluxes through prongs 120-1 through 120-n is zero. This in turn means that the sum of the instantaneous voltages across windings 124-1 through 124-n must also be zero, which in turn means that AC power is exchanged between the individual phases. When applied to the FIG. 2a topology, the FIG. 3a structure serves as an averaging device. The magnitude of AC ripple voltage is reduced by a factor of n, while the ripple frequency is increased by a factor of n. As such, the inductance required to limit current ripple, is reduced by a factor of $n^2$.

It can be shown that the FIG. 3a magnetic element is equivalent to an "averaging transformer" connected in series with an inductance. In turn the voltage of the transformer summing node 118 is equal to the instantaneous average of voltages applied to the winding starts (each voltage is referenced to ground). As such, it can further be shown that the transformer output voltage (referenced to ground) has a DC component equal to Vin*D and an AC peak to peak pulse component of Vin/n with a frequency of n/T. The duty cycle of this AC component, D', is given as D'=n*D−{n*D}, where {n*D} designates the largest integer which is less than or equal to n*D. Switching ripple current is near zero when D' is zero and maximum when D' is 0.5. Thus, for the general n-phase case, ripple current goes to zero as D approaches 0 and 1 and also approaches zero for the other n−1 cases where D=1/n, 2/n, −−(n−1)/n. Likewise, ripple current reaches a maximum for n−1 cases where D=1/(2*n), 3/(2*n), −−(2*n−1)/(2*n). At these worst case points, the volt-seconds applied to the series inductance is Vin*T/(4*n2).

As with any transformer, winding DC voltage components may be sufficiently small such that core saturation does not occur, and, to this end, each of the N switching pole duty cycles may accurately match one another. In many cases, this can be achieved on an open-loop basis if the n signals are digitally generated. In the case where core gaps $g_1$ are present, duty cycles can be feedback adjusted since the flux density for the $j^{th}$ core prong can be observed as a weighted difference between the $j^{th}$ phase current and the average current for all n phases (see FIG. 6). This information can be used to trim the respective duty cycles such that no core element saturates. This approach solves issues such as gate driver and power device skew times.

The added series inductance ($L_s$ in micro Henries) associated with the FIG. 3a magnetic element is approximated by $$L_s = 2.52 * N_t^2 * A_2/(n^2 * g_2), \quad (1)$$

where $N_t$ is the number of turns on each of the core prongs 120-1 through 120-n, $A_2$ is the sectional area of both outer prong 122-a and 122-b (in $m^2$), and $g_2$ is the gap associated with both outer prongs 122-a and 122-b (m). The peak value of the total ripple current, $I_p$, is equal to 0.5 times the volt-seconds divided by the inductance in Henries. Hence, $$I_p = 49,600 * V_{in} * T * (g_2/A_2)/n_t^2 \quad (2)$$

From Eqn. (2), it is noted that the ripple current is independent of the number of phases. This is due to the fact that AC volt-seconds and inductance fall equally fast as n is increased. It is also noted that ripple current falls as $g_2/A_2$ is decreased.

As $g_2/A_2$ is decreased, the DC component of flux density increases for all portions of the ferro-core. This sets a lower bound for $g_2/A_2$ which is provided by the following:

$$g_2/A_2 = 2.51 * (E-6) * n_t I_{DC}/n^2 */A_1/B_{jDC}, \quad (3)$$

where $I_{DC}$ is the total DC current (sum of n phases) and $B_{jDC}$ is the DC component of flux density within any core prong (all n have the same value). In some embodiments $B_{jDC}$ is selected to be about one fourth the core saturation flux density.

Eqn. 3 indicates that as DC current is increased, $g_2$ may be increased in order to prevent magnetic saturation. In turn, steady state DC current is limited by heat transfer and temperature ratings of the materials used in the magnetic element. As heat transfer is improved, maximum allowed DC currents increase—which in turn means that $g_2$ may increase. At some point, $g_2$ becomes equal to h (window height) and the structure of FIG. 3a can be simplified to that of FIG. 3b, where core prongs 122-a and 122-b are eliminated.

For both the FIG. 3a and FIG. 3b configurations, core gaps g1 may be added. As gaps g1 are increased, ripple current magnitudes will increase, while flux saturation sensitivity to DC current imbalance is reduced. In many cases, g1 should be set to zero, as DC current imbalance is inherently small. Core gaps may be placed either within the prongs (g1), as shown in FIGS. 3a and 3b, or they may be placed within the horizontal elements of the core (gx), or within both locations (see FIG. 3c). One advantage of locating gaps within the horizontal core elements is the virtual elimination of fringing flux which enters the winding—thus reducing winding eddy losses. A second advantage is that individual gaps can assume mutually differing values—which may provide benefit in some cases. Core halves 126 and 128 can be designed as identical shapes, or they may be designed as different shapes.

Figure 3C:
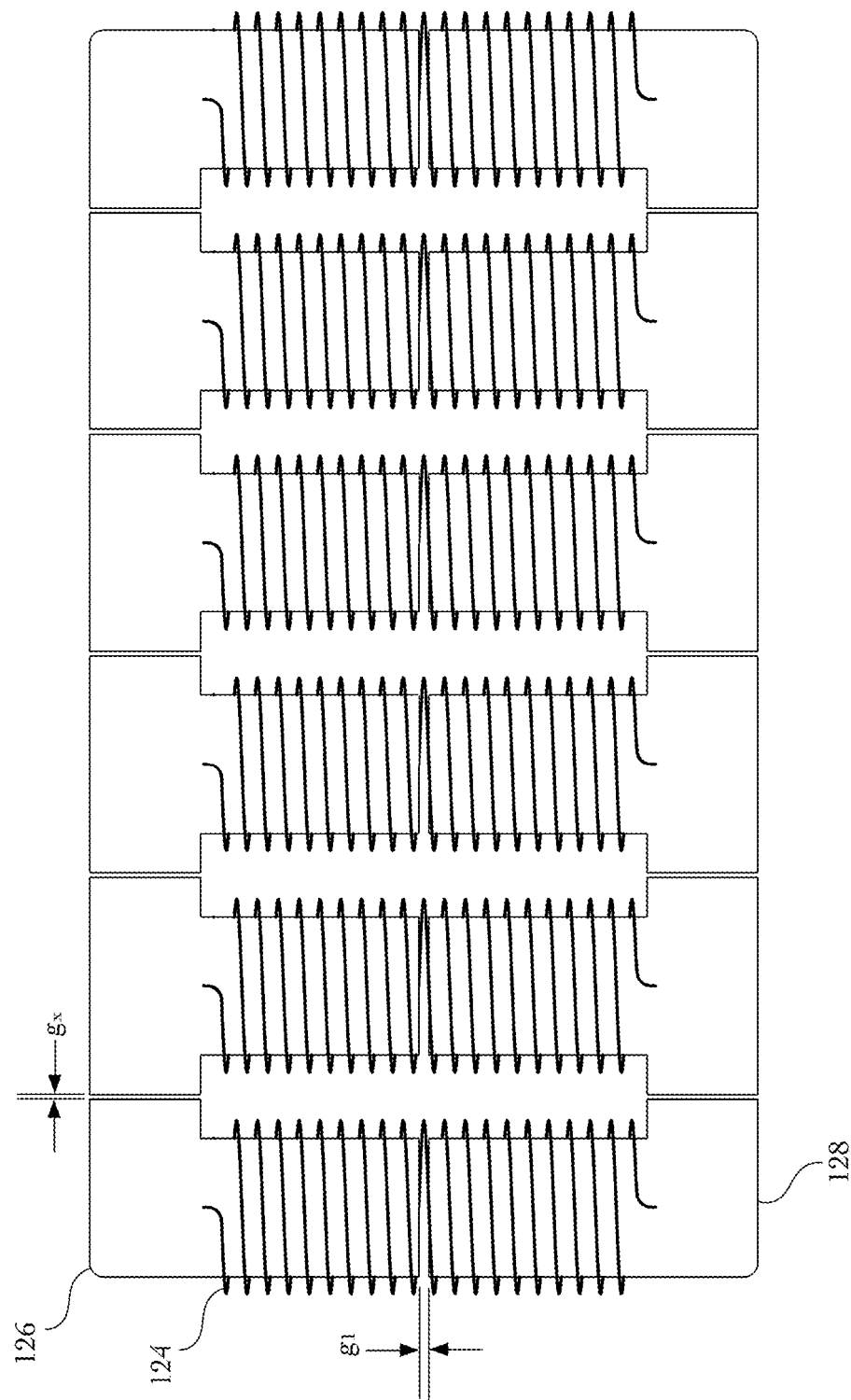
FIG. 3c is a schematic representation of a third embodiment of an n-phase magnetic element which can be used in the FIG. 2a regulator, according to an embodiment of the present disclosure.
Figure 4:
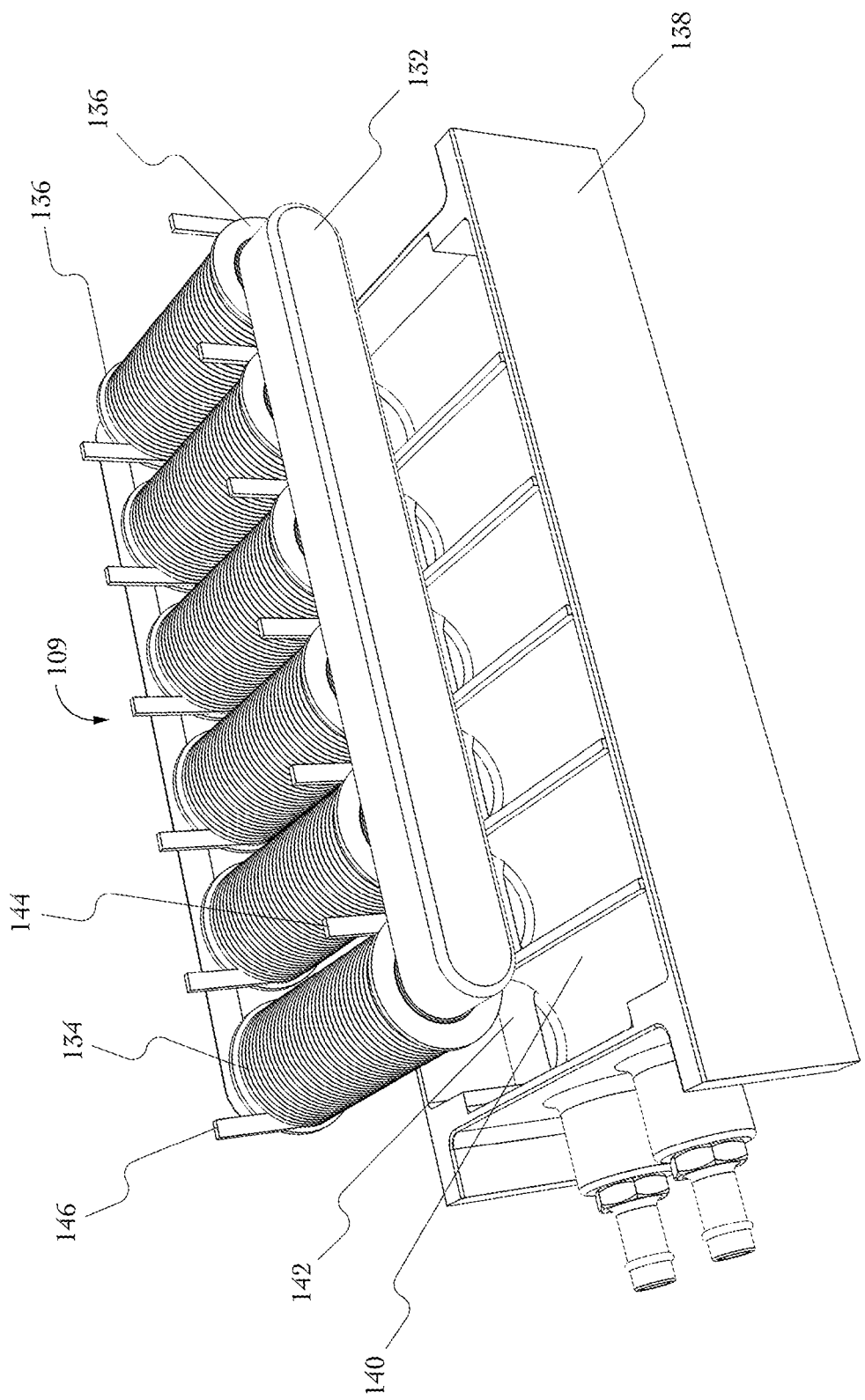
FIG. 4 is a perspective view for a six-phase version of the magnetic element of FIG. 3b, according to an embodiment of the present disclosure.

FIG. 4 shows magnetic element 109 which is a six phase embodiment of the FIGS. 3b and 3c concepts. With the FIG. 4 embodiment, a six pronged ferro-core 132 engages with six single-layer windings 134. Electrically insulating spacers 136 are coaxially placed between each core prong and respective winding such that electrical breakdown does not occur between the two. The winding-core assembly is contained by potting enclosure (or "potting cup") 138. A first portion of the interior surface 140 of potting enclosure 138 conforms closely with outer surface portions of windings 134 such that small gaps are formed between the two when assembled. Likewise, a second interior surface 142 of enclosure 138 conforms closely with portions of ferro-core 132 outer surfaces such that small gaps are formed between the two when assembled. Both winding-enclosure gaps and core-enclosure gaps may be filled with a thermally conductive potting material such that efficient heat transfer is achieved for both the windings and the ferro-core. In most cases, heat transfer is sufficiently high to enable winding current densities in excess of 2000 A/cm2. It should be noted that two or more phases can be used; as the number of phases is increased, ripple currents are progressively decreased. Where a low number of phases is used, and where current densities are low, leakage inductance may not be sufficient to limit current ripple to desired values. In such cases, it may be necessary to add an external inductance in series with the magnetic element to adequately limit ripple currents (see FIG. 2d).

Windings may be formed from copper or aluminum conductor material of rectangular section, although round conductor may be used in some cases. Windings may be edge-wound or face-wound depending on design requirements. Winding starts 144 connect to the phase nodes of the FIG. 2a topology and winding finishes 146 join together to form node 116a of port 116 (see FIG. 2a).

Figure 5:
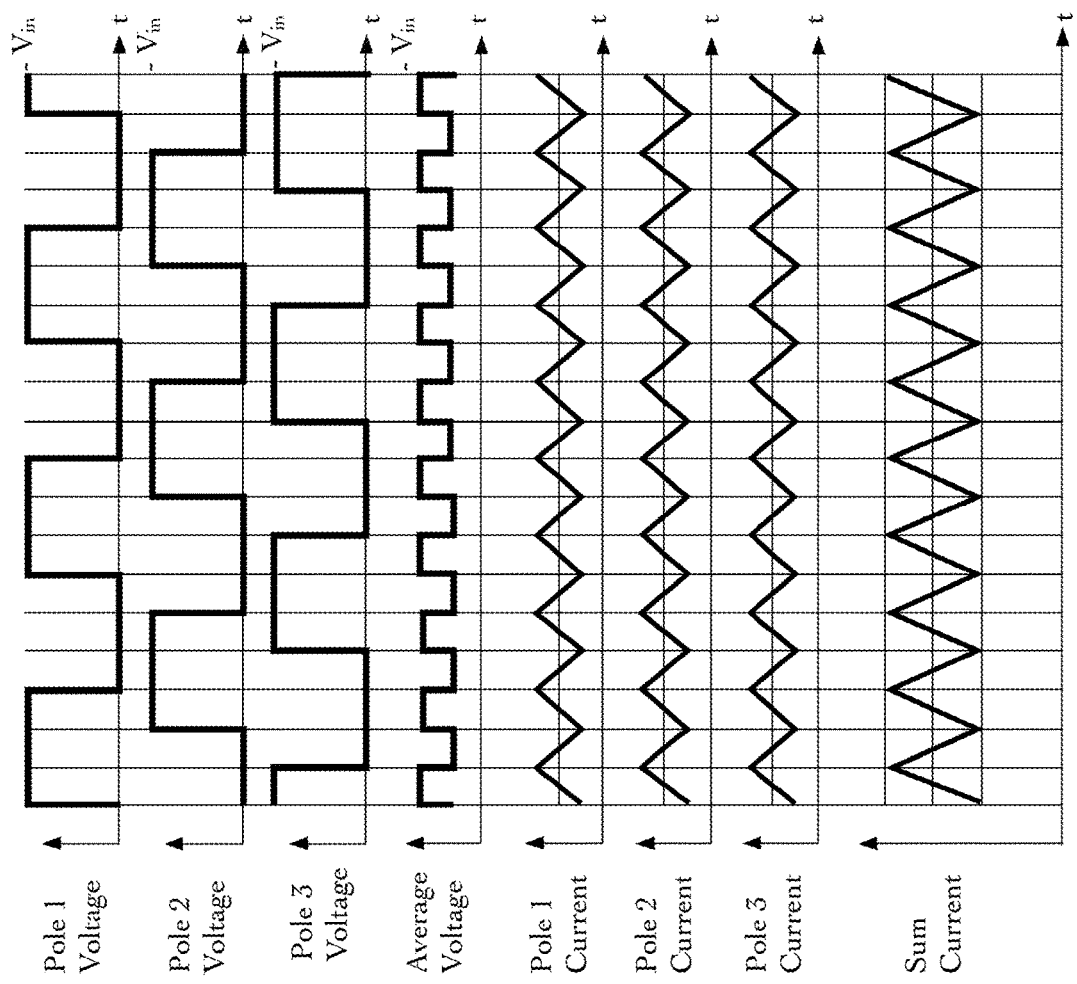
FIG. 5 shows voltage and current waveforms associated with the FIG. 4 magnetic element where gap $g_l$ is negligible, according to an embodiment of the present disclosure.

FIG. 5 shows electrical waveforms for case where a three-phase version of the FIG. 4 element is applied to the FIG. 2a topology, where gap $g_1$ is negligible, and where the duty cycle is 0.50. (All voltage waveforms are with respect to ground.) Due to transformer action, all three phase currents balance and are therefore equal. Ripple frequency is at 3f (three times the switching pole frequency) and ripple magnitude is proportionate to the magnitude of the average voltage (average of phases 1,2, and 3) divided by the product of inductance and frequency. In turn, the inductance is proportionate to the square of the number of turns per phase times the area associated with leakage flux, divided by the gap associated with leakage flux. By controlling aspect ratios, the inductance can be controlled as desired. (In most cases, the inductance should be such that the rms ripple current is no greater than 10% to 20% of the rated DC current.)

Figure 6:
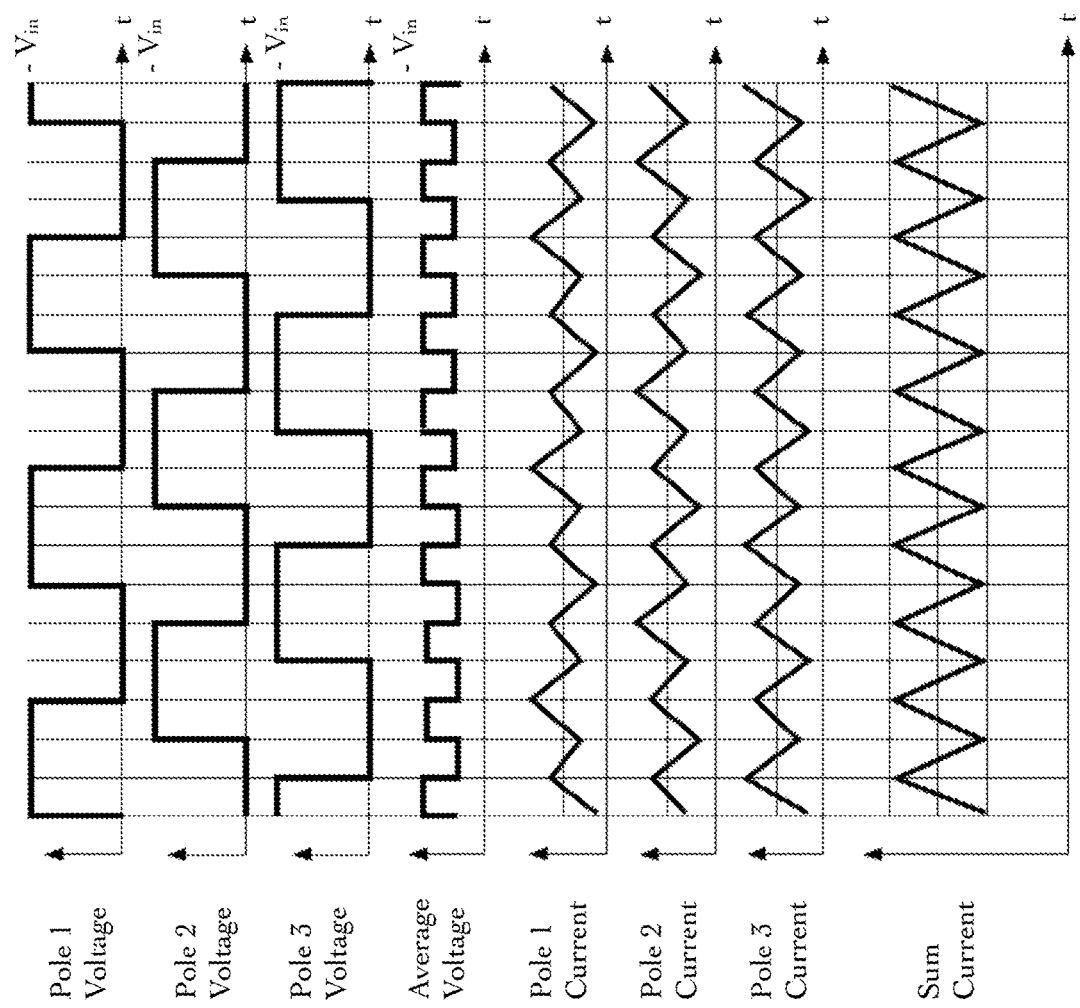
FIG. 6 shows voltage and current waveforms associated with the FIG. 4 magnetic element where gap $g_l$ is finite, according to an embodiment of the present disclosure.

When gaps $g_1$ are added, waveforms are altered as shown in FIG. 6. As $g_1$ is increased, a 1f ripple current component is increasingly added to each phase current. This added current signal can be isolated by subtracting a signal proportionate to the sum of the other n−1 phases. The remaining signal can then serve as a measure of the instantaneous flux density for the $j^{th}$ phase. Each of the n such signals can be applied to controller 193 (as seen in FIGS. 2a and 2c) such that peak flux densities within each prong are maintained equal—which in turn serves to prevent magnetic saturation within any portion of the core.

Figure 7:
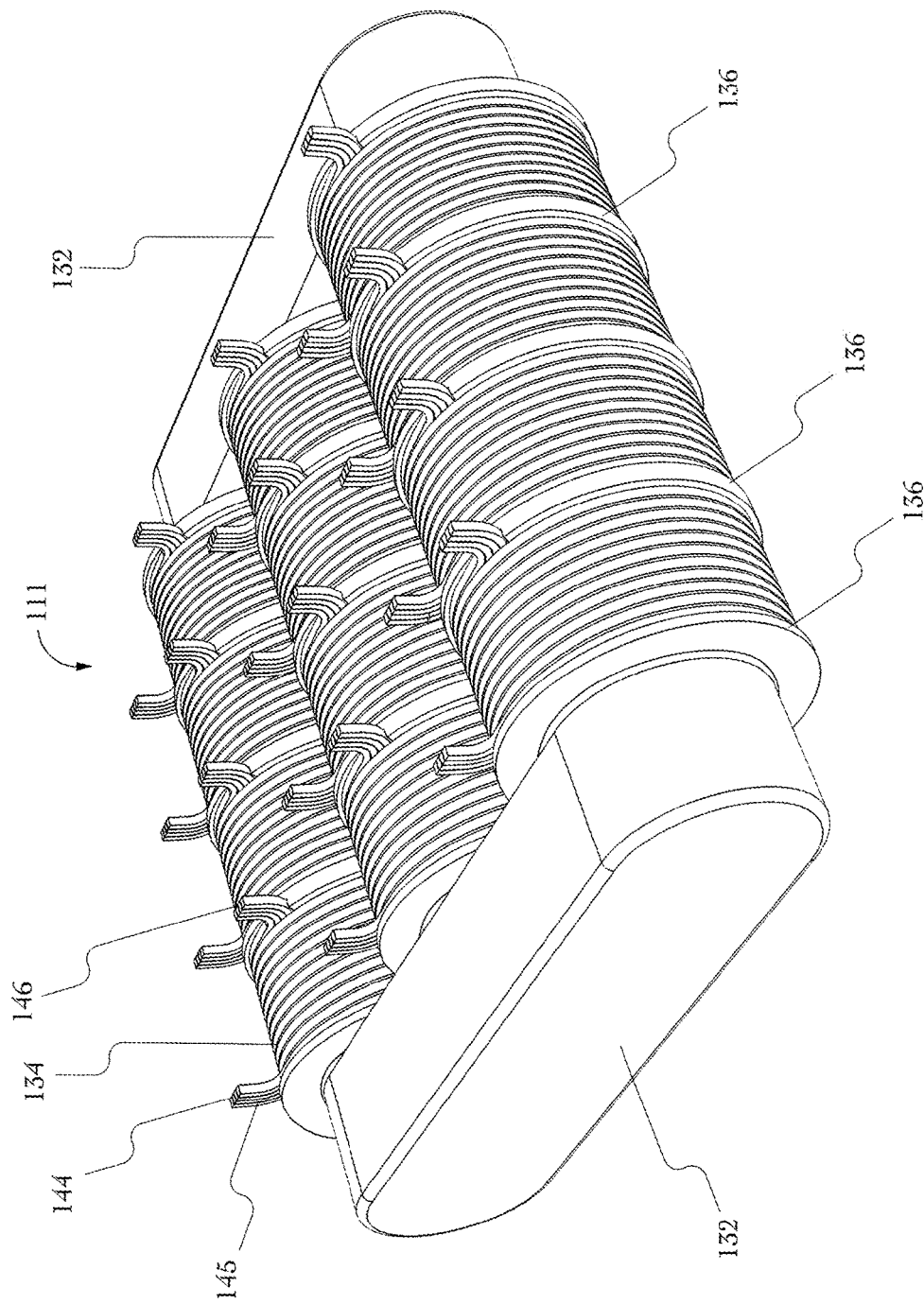
FIG. 7 is a perspective view of a three-phase embodiment of the magnetic element which includes a multi-layered conductor, according to an embodiment of the present disclosure.

FIG. 7 is a perspective view of a three-phase embodiment of the magnetic element 111 which includes a multi-layered conductor. The magnetic element comprises coils 134, common core 132, and winding spacers 136. In turn, coils 134 may be structured from multi-layered conductor 145; each coil has coil start 144 and coil finish 146. Core 132 may be structured from a sintered powder such as powdered iron or ferrite.

By using multiple conductor layers to form each coil, two objectives may be met—reduced high frequency eddy losses and improved ease of winding. In order for the eddy loss reduction to be maximized, a transposition (not shown) may be included at the center point of each coil. With the use of a multi-layered conductor, coil fabrication can, in some cases, be more easily achieved as material stretching and distortion is reduced; this may also improve packing factor in some cases. A potting enclosure similar to that of FIG. 4 may be included thus enabling efficient heat transfer.

Figure 8:
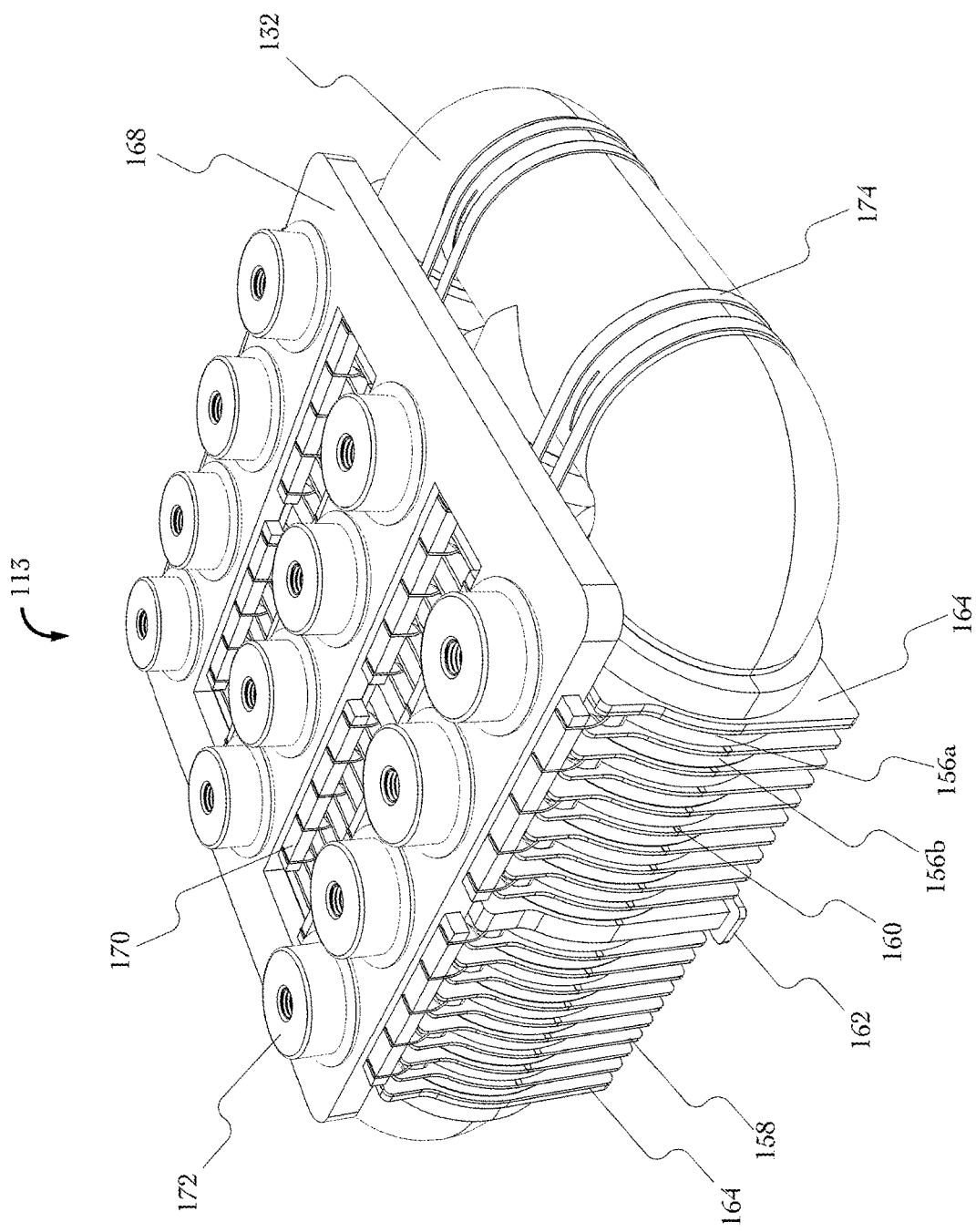
FIG. 8 is a perspective view of a three-phase, fluid-cooled embodiment of the magnetic element which uses parallel connected coils, according to an embodiment of the present disclosure.

FIG. 8 is a perspective view of a three-phase, liquid-cooled embodiment of the magnetic element 113 which uses multiple coils connected in parallel to provide the windings. It should be noted that the FIG. 8 structure conforms magnetically to that of FIG. 3b. The magnetic element comprises core 132 and axially stacked coils 156a and 156b to form the active structure. Core 132 is three pronged and may be fabricated from two identical "E" members. As discussed above, a gap may be included between the core halves such that flux estimation within each core prong becomes possible. Alternatively, the same result can be achieved by using core material having reduced permeability.

Figure 10:
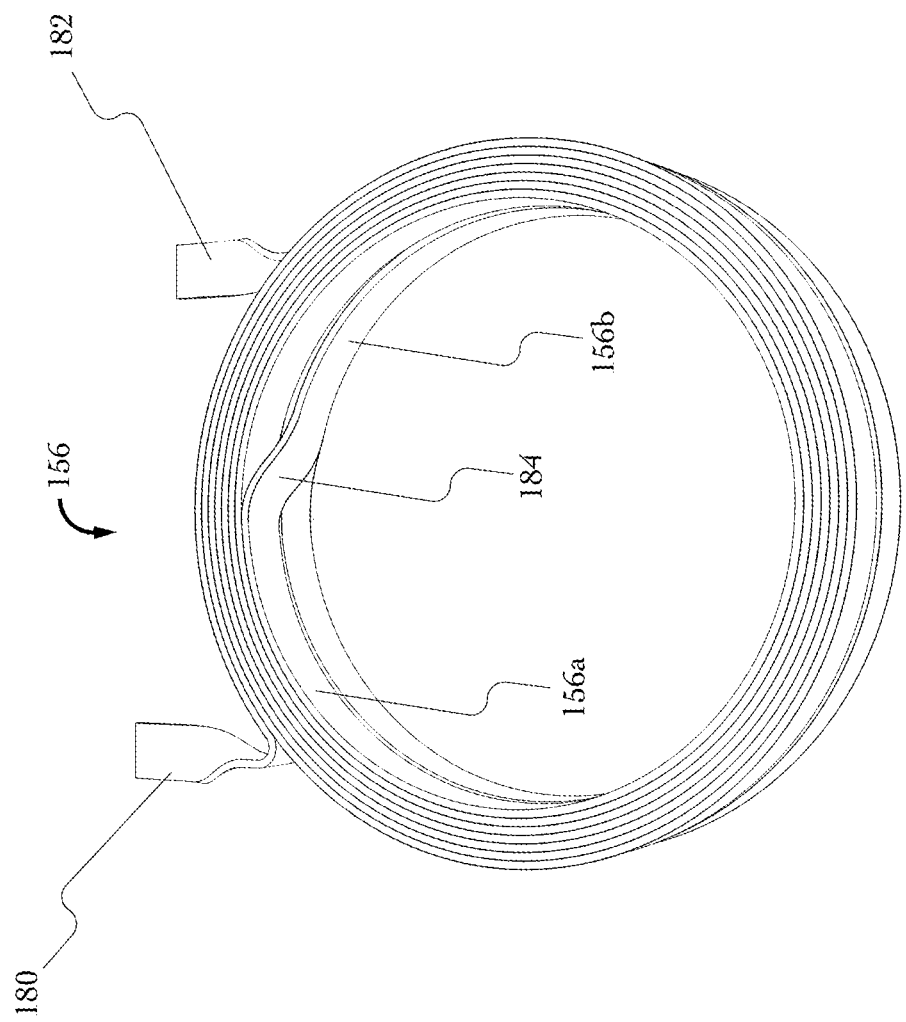
FIG. 10 is a perspective view of a coil used in the FIG. 8 embodiment, according to an embodiment of the present disclosure.

Spiral (e.g., face wound) coils 156a and 156b may be serially connected, as shown in FIG. 10 to form a coil group 156. Interconnection between the two coils may be achieved by "S" bend 184. In turn, coil groups may be connected in series or parallel to achieve desired electrical parameters. By using coil pairs which interconnect at the I.D., both coil starts 180 and coil finishes 182 are at the O.D.—which enables efficient electrical termination.

Adjacent coils 156a and 156b are separated by electrically insulating separators 158. Separators 158 serve to provide enhanced insulation between adjacent coils while establishing thin axial gaps which in turn allows liquid coolant to flow past each coil face. The axial gaps are established by ribs 160 which are integral features of the spacer faces.

Feed plates 162 serves to introduce coolant into an annular gap (not shown) between core 132 and coil pairs 156. End plates 164 serve to axially clamp the stack consisting of coils, spacers, and the feed plate. Axial compression of core 132 is provided by bands 174. Electrical termination is provided by terminal structure 168, which includes termination strips 170 and terminal posts 172.

Figure 9:
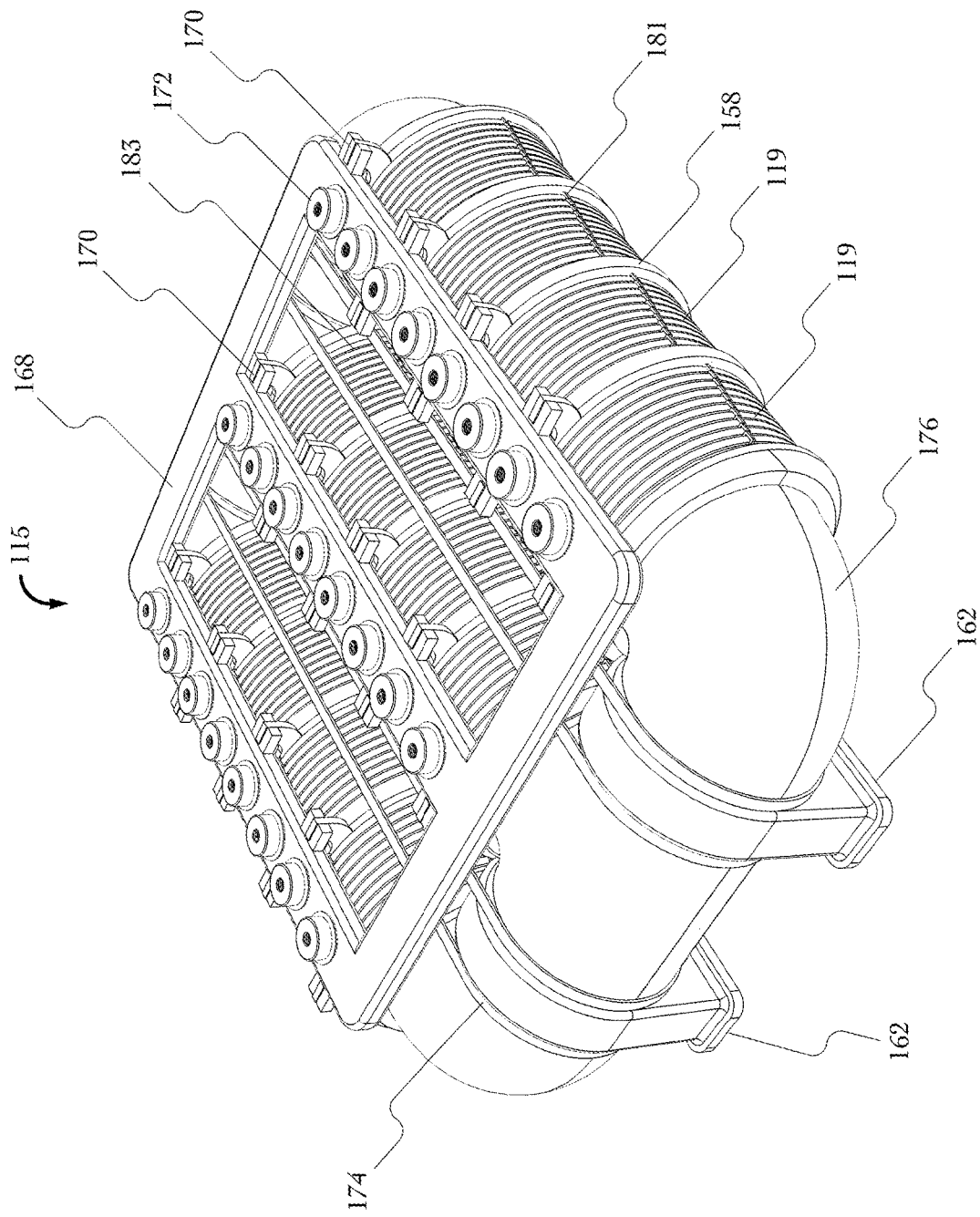
FIG. 9 is a perspective view of a three-phase, fluid-cooled embodiment of the magnetic element which uses helical coils, according to an embodiment of the present disclosure.
Figure 11:
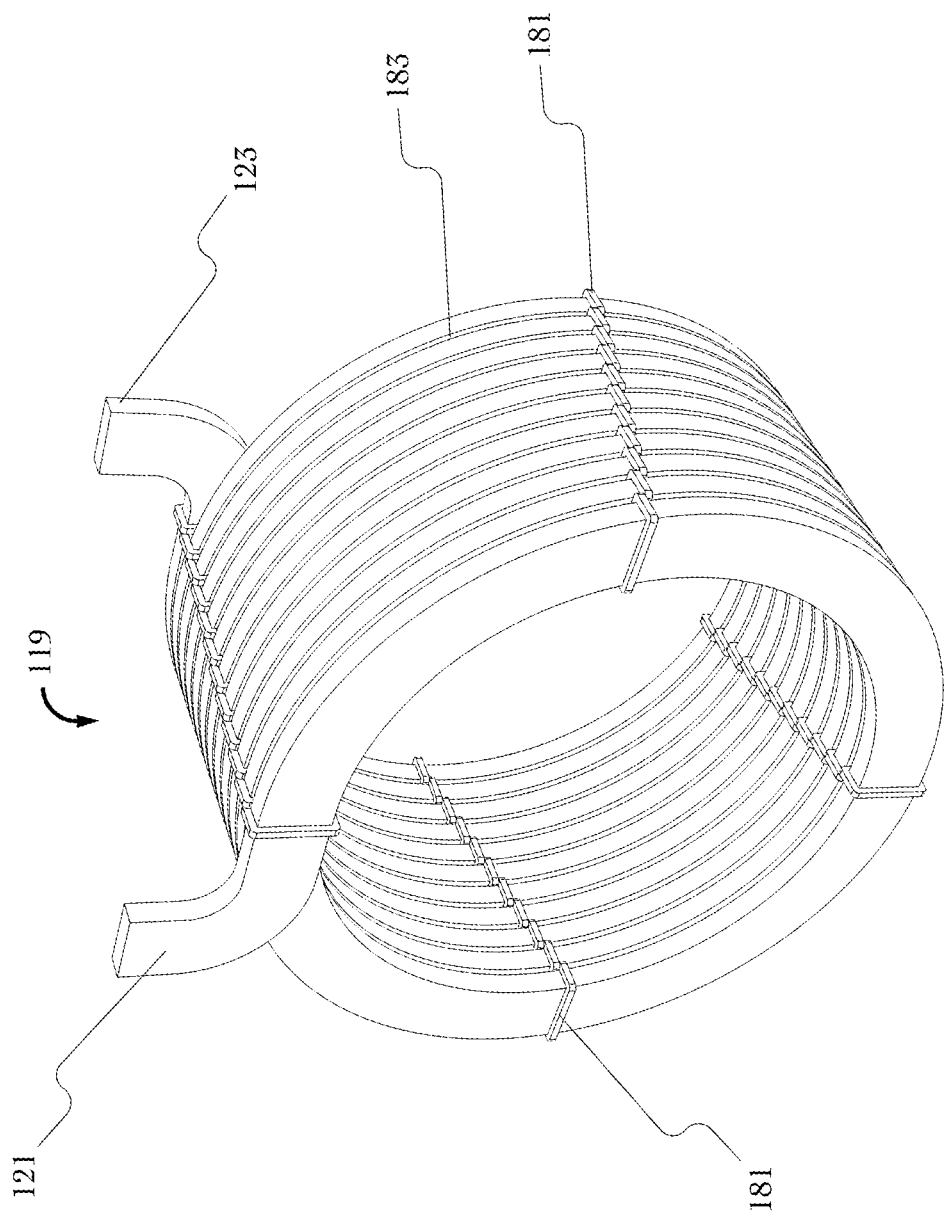
FIG. 11 is a perspective view of a coil used in the FIG. 9 embodiment, according to an embodiment of the present disclosure.

FIG. 9 is a perspective view of a three-phase, liquid-cooled embodiment of the magnetic element 115 which conforms to the magnetic element of FIG. 3b and which comprises core 132, helical coils 119 (see FIG. 11), feed plates 162, and manifolds 176. Adjacent turns of coils 119 (see FIG. 11) are separated by spacers 181 such that precise gaps 183 are formed. Coolant received by feed plates 162 (see FIG. 9) is directed via manifolds 176 to flow within an annular gap between coils 119 and the core such that coolant then flows radially outward through gaps 183 (see FIG. 11). It should be noted that the FIG. 9 embodiment conforms electromagnetically to the FIG. 3b arrangement.

Individual windings 119 include winding starts 121 and winding finishes 123, each of which terminate via terminal element 168 (see FIG. 9) which in turn includes terminal strips 170 and terminal posts 172 which electrically interconnect. Bands 174 hold the respective elements together under compression.

Some embodiments of the switching regulator described herein can provide the buck, boost, and buck-boost functions associated with DC power processing. Some embodiments of the switching regulator described herein can be used as a substitute for a switching pole in a conventional inverter (e.g., a polyphase inverter), and such a substitution may have the effect of producing a smooth output waveform (or smooth output waveforms) instead of one or more pulse waves. Some embodiments of the switching regulator described herein can also replace the individual poles associated with polyphase inverters such as those used for motor drives, solar inverters and the like.

As used herein, the word "or" is inclusive, so that, for example, "A or B" means any one of (i) A, (ii) B, and (iii) A and B.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a polyphase switching regulator have been specifically described and illustrated herein, many modifications and variations will be apparent to those skilled in the art. Accordingly, it is to be understood that a polyphase switching regulator constructed according to principles of this disclosure may be embodied other than as specifically described herein. The invention is also defined in the following claims, and equivalents thereof.

What is claimed is:
1. A circuit, comprising:
   a magnetic element and n switching poles, each of the switching poles including a phase node;
   a high voltage port having a first node and a second node;
   a low voltage port having a first node and a second node; and
   a high voltage capacitance,
   wherein:
   a switching pole phase node is connected to a respective first port of the magnetic element, the magnetic element comprises n first ports and a summing port, n being a positive integer, the instantaneous current at the summing port is equal to the sum of the currents at the first ports, the instantaneous voltage at the summing port is substantially equal to the average of the instantaneous voltages at the first ports, the high voltage capacitance is connected across the high voltage port, the first node of the high voltage port is connected to a first node of a switching pole of the n switching poles, the second node of the high voltage port is connected to a second node of a switching pole of the n switching poles and to the second node of the low voltage port, and the summing port of the magnetic element is connected to the first node of the low voltage port.

2. The circuit of claim 1, wherein the high voltage port is an input and the low voltage port is an output and the circuit is configured to operate in buck mode.

3. The circuit of claim 1, wherein the high voltage port is an output and the low voltage port is an input and the circuit is configured to operate in boost mode.

4. The circuit of claim 1, wherein:
the high voltage port is both an input and an output,
the low voltage port is both an input and an output, and
the circuit is configured to operate in both buck mode and boost modes.

5. The circuit of claim 1, further comprising a low voltage capacitance connected across the low voltage port.

6. The circuit of claim 1, further comprising a controller configured to provide, to the n switching poles, respective switching commands having approximately equal duty cycles.

7. The circuit of claim 6, wherein each of the duty cycles is selected such that magnetic saturation does not occur within the magnetic element.

8. The circuit of claim 6, wherein at least one phase current is sensed.

9. The circuit of claim 6, wherein the n respective switching commands are spaced symmetrically or approximately symmetrically over one switching period.

10. The circuit of claim 1, not including an external inductor in series with the summing port of the magnetic element.

11. The circuit of claim 1, further comprising an external inductance in series with the summing port of the magnetic element.

12. The magnetic element of claim 1 wherein n is an integer greater than 2.

13. The circuit of claim 1, wherein the magnetic element comprises N phases, N being a positive integer greater than 2, wherein two or more windings are associated with a first phase of the N phases.

14. A circuit, comprising:
a magnetic element and n switching poles, each of the switching poles including a phase node;
a controller configured to provide switching commands for at least one switching pole of the n switching poles;
wherein:
a switching pole phase node is connected to a respective first port of the magnetic element,
the magnetic element comprises n first ports and a summing port, n being a positive integer,
the instantaneous current at the summing port is equal to the sum of the currents at the first ports;
the instantaneous voltage at the summing port is substantially equal to the average of the instantaneous voltages at the first ports; and
the controller is configured to provide, to the n switching poles, respective switching commands having approximately equal duty cycles.

15. The circuit of claim 14, wherein each of the duty cycles is selected such that magnetic saturation does not occur within the magnetic element.

16. The circuit of claim 14, wherein at least one phase current is sensed.

17. The circuit of claim 14, wherein the n respective switching commands are spaced symmetrically or approximately symmetrically over one switching period.

18. The circuit of claim 14, wherein:
the magnetic element comprises a core including a plurality of core elements, the core having a gap; and
the controller is configured to adjust, based on a feedback signal, a duty cycle so as to avoid saturation of each of the core elements.

19. The circuit of claim 14 wherein the magnetic element comprises a core, the core lacking a gap.

20. A magnetic element comprising:
n first ports and a summing port, n being a positive integer;
a magnetic core and an electrically conductive winding, wherein:
the instantaneous current at the summing port is equal to the sum of the currents at the first ports;
the instantaneous voltage at the summing port is substantially equal to the average of the instantaneous voltages at the first ports;
the magnetic core of the magnetic element comprises:
a first back iron member,
a second back iron member, and
a plurality of core prongs; and
a first core prong of the core prongs bridges between the first and second back iron members.

21. The magnetic element of claim 20, further comprising a thermally conductive potting cup having a surface conformed to a surface of the winding or of the magnetic core.

22. The magnetic element of claim 20, configured to enable direct cooling of the winding by cooling fluid.

* * * * *